(12) United States Patent
Park et al.

(10) Patent No.: US 9,329,504 B2
(45) Date of Patent: May 3, 2016

(54) METHOD OF ALIGNING AN EXPOSURE APPARATUS, METHOD OF EXPOSING A PHOTORESIST FILM USING THE SAME AND EXPOSURE APPARATUS FOR PERFORMING THE METHOD OF EXPOSING A PHOTORESIST FILM

(71) Applicant: SAMSUNG ELECTRONICS CO., LTD., Suwon-Si, Gyeonggi-Do (KR)

(72) Inventors: Sang-Hyun Park, Yongin-si (KR); Sang-Don Jang, Ansan-si (KR); Dong-Seok Baek, Suwan-si (KR); Ki-Hyun Kim, Suwan-si (KR); Sang-Min Lee, Suwan-si (KR); Dong-Min Kim, Suwan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 622 days.

(21) Appl. No.: 13/681,068

(22) Filed: Nov. 19, 2012

(65) Prior Publication Data

US 2013/0077075 A1 Mar. 28, 2013

Related U.S. Application Data

(63) Continuation of application No. 12/402,416, filed on Mar. 11, 2009, now Pat. No. 8,314,920.

(30) Foreign Application Priority Data

Apr. 29, 2008 (KR) .................... 10-2008-0039789

(51) Int. Cl.
| | | |
|---|---|---|
| *G03B 27/42* | (2006.01) | |
| *G03F 9/00* | (2006.01) | |
| *G03B 27/32* | (2006.01) | |
| *G03F 7/20* | (2006.01) | |

(52) U.S. Cl.
CPC .............. *G03F 9/7069* (2013.01); *G03B 27/32* (2013.01); *G03B 27/42* (2013.01);

(Continued)

(58) Field of Classification Search
CPC .... G03B 27/32; G03B 27/42; G03F 7/70258; G03F 7/70275; G03F 7/70791; G03F 9/7069; G03F 9/7011; G03F 9/7015; G03F 9/7019; G03F 9/7088; G03F 9/7003
See application file for complete search history.

(56) References Cited

U.S. PATENT DOCUMENTS

| 5,715,037 A | 2/1998 | Saiki et al. |
| 6,608,666 B2 * | 8/2003 | Deguchi et al. ................ 355/53 |
| 2005/0271421 A1 | 12/2005 | Uemura et al. |
| 2009/0059297 A1 | 3/2009 | Uemura |

FOREIGN PATENT DOCUMENTS

| JP | 2006-268032 | 10/2006 |
| KR | 10-2004-0111029 | 12/2004 |

(Continued)

OTHER PUBLICATIONS

Korean Notice of Allowance dated Jul. 30, 2014 issued in corresponding Korean Application No. 10-2008-0039789.

*Primary Examiner* — Mesfin T Asfaw
(74) *Attorney, Agent, or Firm* — Harness, Dickey & Pierce, P.L.C.

(57) ABSTRACT

An origin of a reference coordinate system is assigned to one of a plurality of center points, and center point coordinates according to the reference coordinate system are assigned to remaining center points, so that reference marks successively correspond to center points of a plurality of microscopes fixed to a base. Beam position detection marks disposed between the reference marks with exposure points of exposure heads fixed to the base are crossed to assign beam coordinates according to the reference coordinate system to the exposure points. Thus, alignment may be easily and accurately performed, and is effective for increasingly larger apparatuses.

11 Claims, 10 Drawing Sheets

(52) U.S. Cl.

CPC ... *G03F 7/70258* (2013.01); *G03F 7/70275* (2013.01); *G03F 7/70791* (2013.01); *G03F 9/7003* (2013.01); *G03F 9/7011* (2013.01); *G03F 9/7015* (2013.01); *G03F 9/7019* (2013.01); *G03F 9/7088* (2013.01)

(56) References Cited

FOREIGN PATENT DOCUMENTS

| | | |
|---|---|---|
| KR | 10-0742597 B1 | 7/2007 |
| KR | 10-2007-0095268 | 9/2007 |
| KR | 2007-0105997 A | 10/2007 |

\* cited by examiner

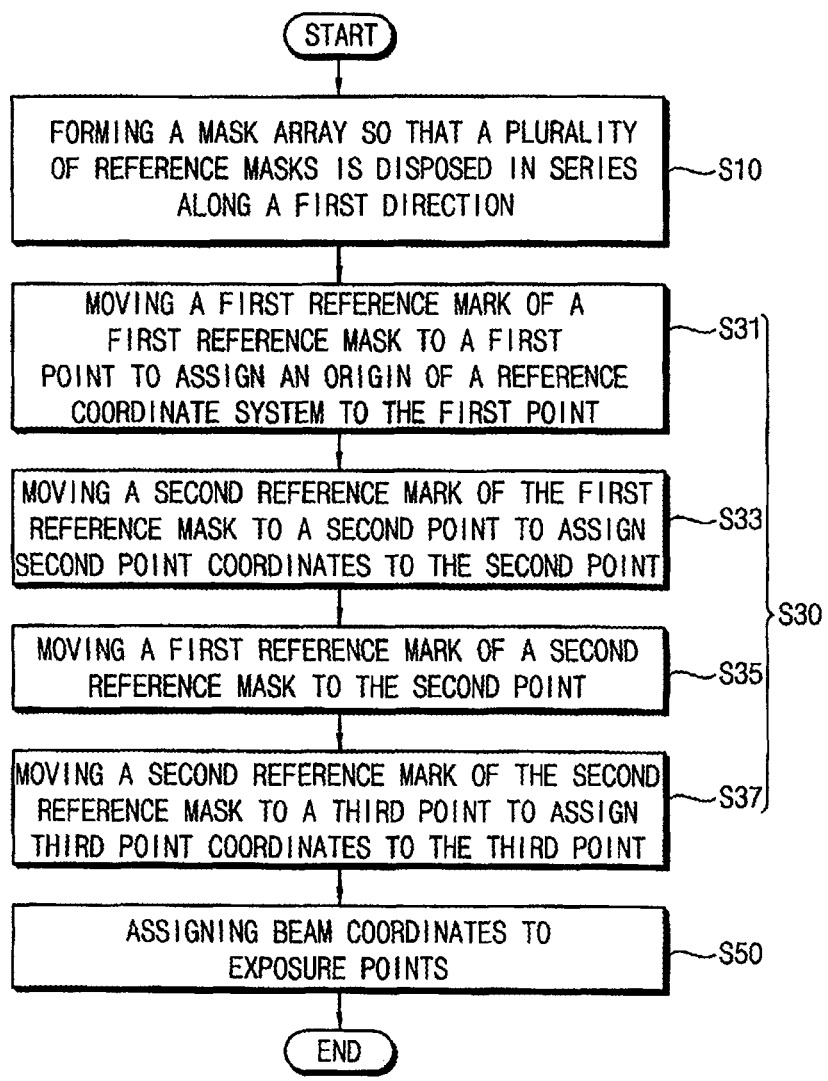

METHOD OF ALIGNING AN EXPOSURE APPARATUS, METHOD OF EXPOSING A PHOTORESIST FILM USING THE SAME AND EXPOSURE APPARATUS FOR PERFORMING THE METHOD OF EXPOSING A PHOTORESIST FILM

PRIORITY STATEMENT

This application is a continuation application of U.S. patent application Ser. No. 12/402,416 filed on Mar. 11, 2009, which claims priority to Korean Patent Application No. 10-2008-0039789, filed on Apr. 29, 2008 in the Korean Intellectual Property Office (KIPO), and all the benefits accruing therefrom under 35 U.S.C. §119, the contents of the prior applications being herein incorporated by reference.

BACKGROUND OF THE INVENTION

1. Field of the Invention

Example embodiments of the present invention relate to a method of aligning an exposure apparatus, a method of exposing a photoresist film using the method of aligning an exposure apparatus, and an exposure apparatus for performing the method of exposing a photoresist film. More particularly, example embodiments of the present invention relate to a method of aligning an exposure apparatus without using an optical mask but employing a digital mode, a method of exposing a photoresist film using the method of aligning an exposure apparatus and an exposure apparatus for performing the method of exposing a photoresist film.

2. Description of the Related Art

In a process of manufacturing a printed circuit board (PCB), a semiconductor wafer, a substrate of a liquid crystal display (LCD) panel, etc., a complex circuit pattern is typically formed on a base substrate such as an insulation substrate or a glass substrate. A photolithography method is widely used to form the circuit pattern.

According to the photolithography method, a photoresist film is formed on a base substrate, and then a transfer pattern corresponding to the circuit pattern is used to expose the photoresist film. Thus, a photo mask is very precisely manufactured, and expensive. Hence, an improved process for reducing the number of the photo masks or a method of exposing the photoresist film without using the photo mask has been studied. As the size of a substrate of an LCD panel becomes larger, manufacturing costs and management for a photo mask exposing the substrate greatly increases.

Examples of exposure methods that do not use the photo mask include a digital exposure method, which is receiving attention as a method in which turning exposure beams on and off are controlled for each pixel of a transfer pattern in a digital mode.

In the digital exposure method, accurately performing coordinate alignment, which aligns exposure areas of a substrate corresponding to a target object and exposure beams, has become a very important issue. A method of conveniently and accurately performing the coordinate alignment is required, and a method of setting a coordinate system for a large size is also required as target substrates are becoming increasingly larger.

SUMMARY OF THE INVENTION

Example embodiments of the present invention provide a method of aligning an exposure apparatus capable of easily and accurately setting reference coordinates.

Example embodiments of the present invention also provide a method of exposing a photoresist film using the above-mentioned method of aligning an exposure apparatus.

Example embodiments of the present invention also provide an exposure apparatus for performing the above-mentioned method of exposing a photoresist film.

According to one aspect of the present invention, a method of aligning an exposure apparatus is provided. An origin of a reference coordinate system is assigned to one of center points of a plurality of microscopes fixed to a base, and center point coordinates according to the reference coordinate system are assigned to remaining points of the center points, so that reference marks successively correspond to the center points. Beam position detection marks disposed between the reference marks with exposure points of exposure heads fixed to the base are crossed to assign beam coordinates to the exposure points according to the reference coordinate system.

In an example embodiment, before assigning the origin and the center point coordinates, a plurality of reference masks having the reference marks spaced apart from each other in a first direction and in a second direction substantially perpendicular to the first direction and the beam position detection marks formed between the reference marks may be disposed in series along the first direction on the base to form a reference mask array.

In order to assign the origin and the center point coordinates, for example, a first reference mark formed on a first reference mask may be moved to a first center point of a first microscope to assign the origin to the first center point. A second reference mark which is formed on the first reference mask and spaced apart from the first reference mark substantially in the first direction may be moved to a second center point of a second microscope adjacent to the first microscope to assign second center point coordinates to the second center point. A first reference mark of a second reference mask which is arrayed in series next to the first reference mask along the first direction may be moved to the second center point. Third center point coordinates may be assigned to a third center point so that a second reference mark of the second reference mask corresponds to a third center point of a third microscope adjacent to the second microscope.

In order to assign the center point coordinates, before moving the second reference mark of the first reference mask to the second center point, a third reference mark which is formed on the first reference mask and spaced apart from the first reference mark substantially in the second direction may be moved to the first center point to detect the coordinates of the second reference mark.

Alternatively, in order to assign the center point coordinates, before moving the second reference mark to the second center point, the second reference mark of the first reference mask may be moved to the first center point to detect the coordinates of the second reference mark.

In order to assign the beam coordinates, an exposure beam may be irradiated onto the beam position detection marks moving in the second direction by using the exposure heads. The beam coordinates may be generated based on the position of the exposure beam with respect to the beam position detection marks and a moving distance of the beam position detection mark.

Substrate coordinates according to the reference coordinate system may be assigned to an alignment mark of a target substrate observed by each microscope. In order to assign the substrate coordinates, the alignment mark may be moved within an observation area of the microscope. The substrate coordinates may be generated based on a displacement from the center point of the microscope to the alignment mark and a moving distance of the alignment mark.

According to another aspect of the present invention, there is provided a method of exposing a photoresist film. A reference mask array has reference masks disposed in series along a first direction so that reference marks formed on the reference masks successively correspond to center points of a plurality of microscopes fixed to a base. An origin of a reference coordinate system is assigned to one of the center points, and center point coordinates are assigned to remaining points of the center points according to the reference coordinate system.

Beam position detection marks formed between the reference marks with exposure points of exposure heads are generated to assign beam coordinates to the exposure points according to the reference coordinate system.

A target substrate is moved within an observation area of each microscope to assign substrate coordinates to an alignment mark of the target substrate according to the reference coordinate system.

Turning the exposure points on and off is controlled in accordance with image data indicating a transfer pattern based on the substrate coordinates and the beam coordinates to expose a photoresist film formed on the target substrate.

A moving distance of the reference mask array may be detected with respect to the base.

In order to assign the substrate coordinates, the target substrate may be loaded onto a stage. The stage is moved so that the alignment mark of the target substrate may be within the observation area of the microscope. A displacement of the alignment mark with respect to the center point of the microscope may be detected from an image observed by the microscope.

Before exposing the photoresist film, target coordinates designating an exposure position on the photoresist film may be generated by correcting the image data based on the substrate coordinates and the beam coordinates.

In order to assign the origin and the center point coordinates, a first reference mark formed on a first reference mask may be moved to a first center point of a first microscope to assign the origin to the first center point.

A second reference mark which is formed on the first reference mask and spaced apart from the first reference mark substantially in the first direction may be moved to a second center point of a second microscope adjacent to the first microscope to assign second center point coordinates to the second center point.

A first reference mark of a second reference mask which is arrayed in series next to the first reference mask along the first direction may be moved to the second center point. Third center point coordinates may be assigned to a third center point so that a second reference mark of the second reference mask corresponds to a third center point of a third microscope adjacent to the second microscope.

Before moving the second reference mark to the second center point, a third reference mark spaced apart from the first reference mark substantially in the second direction may be moved to the first center point to detect the coordinates of the second reference mark.

Alternatively, before moving the second reference mark to the second center point, the second reference mark may be moved to the first center point to detect the coordinates of the second reference mark.

A first reference mark of a second reference mask which is arrayed in series next to the first reference mask along the first direction may be moved to the second center point.

Third center point coordinates may be assigned to the third center point so that the second reference mark of the second reference mask corresponds to a third center point of a third microscope adjacent to the second microscope.

According to still another aspect of the present invention, an exposure apparatus includes a base, a stage, a plurality of reference masks, a photographing module, a scan module and a system control part.

The stage moves a target substrate on the base.

The reference masks includes a plurality of reference marks disposed in series along a first direction on the stage and spaced apart from each other in the first direction and in a second direction substantially perpendicular to the first direction and beam position detection marks.

The photographing module includes a plurality of microscopes fixed to the base. An origin of a reference coordinate system and center point coordinates of each microscope are determined so that each reference mark moved by the stage corresponds to a center point of a microscope. The microscopes observe substrate coordinates of an alignment mark of the target substrate.

The scan module includes a plurality of exposure heads fixed to the base with respect to positions. Beam coordinates of each exposure head are determined using the beam position detection marks. The exposure heads irradiate exposure beams onto a photoresist film formed on the target substrate in accordance with image data transferred onto the target substrate.

The system control part calculates the center point coordinates, the substrate coordinates and the beam coordinates, and controls movement of the stage and scan timing of the scan module based on the substrate coordinates and the beam coordinates.

In an example embodiment, the exposure apparatus may further include a position-detecting sensor irradiating light onto the stage to measure a moving distance in the first and second directions of the stage.

The system control part may include a data processing section, a moving control section and a scan control section.

The data processing section generates the center point coordinates and the beam coordinates based on the origin, the moving distance of the stage and a positional relationship between the reference mark and the beam position detection marks, and generates target coordinates designating an exposure position by correcting the image data based on the substrate coordinates and the beam coordinates. The moving control section outputs a moving signal moving the stage in the first and second directions. The scan control section controls on and off timing of the exposure beams based on the moving signal and the target coordinates.

Each of the exposure heads may include a digital micromirror device (DMD) of which pixels selectively reflecting source beams provided from a laser source in accordance with the image data, and an optical device projecting the selectively reflected beams from the DMD into the exposure beams.

According to the above, coordinates according to a single reference coordinate system may be easily assigned to a microscope, an exposure head and a target substrate to improve the efficiency of an exposure process. In addition, a plurality of reference masks may be aligned to easily expose a photoresist film on a large-size target substrate, and the microscope, the coordinates of the exposure head and the target substrate may be read by moving only a stage, to greatly reduce alignment errors.

BRIEF DESCRIPTION OF THE DRAWINGS

The above and other features and advantages of the present invention will become more apparent by describing in detailed example embodiments thereof with reference to the accompanying drawings.

FIG. 1 is a flowchart illustrating a method of aligning an exposure apparatus before exposing a target substrate by using the exposure apparatus;

DETAILED DESCRIPTION OF THE INVENTION

Figure 2A:
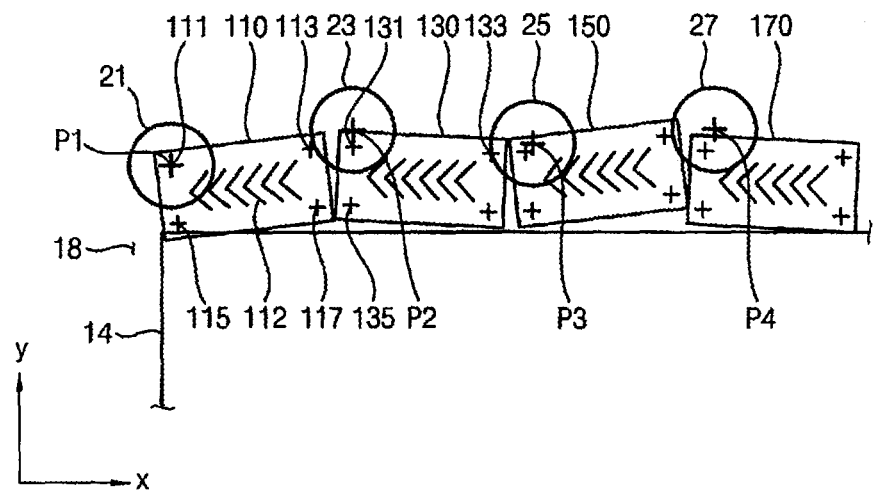
FIGS. 2A to 2E are plan views illustrating the method of aligning the exposure apparatus in FIG. 1.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Method of Aligning an Exposure Apparatus

Aligning an exposure apparatus implies that before an exposure process for a target object is performed, a reference coordinate system is set, and present coordinates of various modules of the exposure apparatus are confirmed according to the reference coordinate system, so that actual positions onto which exposure beams are irradiated are finally confirmed according to the reference coordinate system. After the exposure apparatus is aligned, exposure points of the target object and the exposure beams may be accurately aligned to perform the exposure process.

FIG. 1 is a flowchart illustrating a method of aligning an exposure apparatus before exposing a target substrate by using the exposure apparatus. FIGS. 2A to 2E are plan views illustrating the method of aligning the exposure apparatus in FIG. 1.

Referring to FIGS. 1 and 2A, in order to align an exposure apparatus, first, an origin of the reference coordinate system is assigned to one of the center points P1, P2, P3 and P4, and center point coordinates according to the reference coordinate system are assigned to remaining points of the center points P1, P2, P3 and P4, so that reference marks 111, 113, 115 and 117 successively correspond to center points P1, P2, P3 and P4 of a plurality of microscopes 21, 23, 25 and 27 fixed to a base 18 (step S30).

Before assigning the origin and the center point coordinates, as illustrated in FIG. 2A, a reference mask array may be formed (step S10). The reference mask array is formed by aligning a plurality of reference masks in a row, and the reference mask corresponds to a reference for confirming and setting a position relationship between the various modules of the exposure apparatus.

In a method of aligning an exposure apparatus according to an example embodiment of the present invention, the larger the size of a target object becomes, the more a plurality of the reference masks is arranged in series. Thus, the method of aligning the exposure apparatus may greatly enlarge an area of the reference coordinate system. For example, a plurality of reference masks is disposed in series along a first direction X of the base 18 to form the reference mask array. First, second, third and fourth reference masks 110, 130, 150 and 170 arranged in series along the first direction X are illustrated in FIG. 2A.

The reference mask 110 may have a substantially rectangular shape. Four reference marks 111, 113, 115 and 117 are formed on four corner portions of the reference mask 110 to be spaced apart from each other in the first direction X and a second direction Y substantially perpendicular to the first direction X, and beam position detection marks 112 are formed on the reference mask 110.

In order to assign the origin and the center point coordinates, for example, as illustrated in FIG. 2A, the first reference mark 111 formed on the first reference mask 110 is moved to the first center point P1 of the first microscope 21 to assign the origin to the first center point P1 (step S31).

The stage 14 is controlled by a system control part to be moved in the first direction X and the second direction Y. The stage 14 moves the reference masks 110, 130, 150 and 170 in the first and second directions X and Y.

When the first reference mark 111 of the first reference mask 110 is aligned to the first center point P1 of the first microscope 21 by the stage 14, the origin of the reference coordinate system is assigned to the first center point P1. The position of the first center point P1 may be stored in a data memory of the system control part.

The reference coordinate system may correspond to a plane coordinate system, and may have two coordinate axes substantially perpendicular to each other with the origin of the first center point P1. The two coordinate axes may be substantially the same as the first and second directions X and Y. When the stage 14 ascends and descends, the reference coordinate system may correspond to a three-dimensional coordinate system.

Figure 2B:
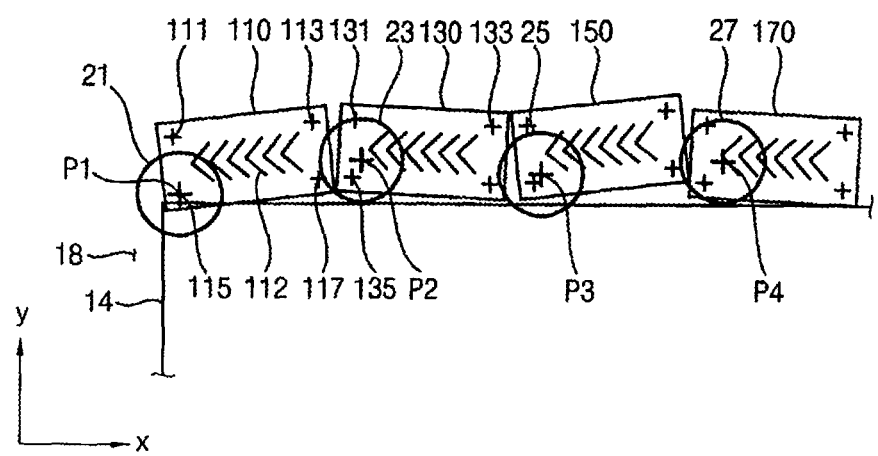
Figure 2C:
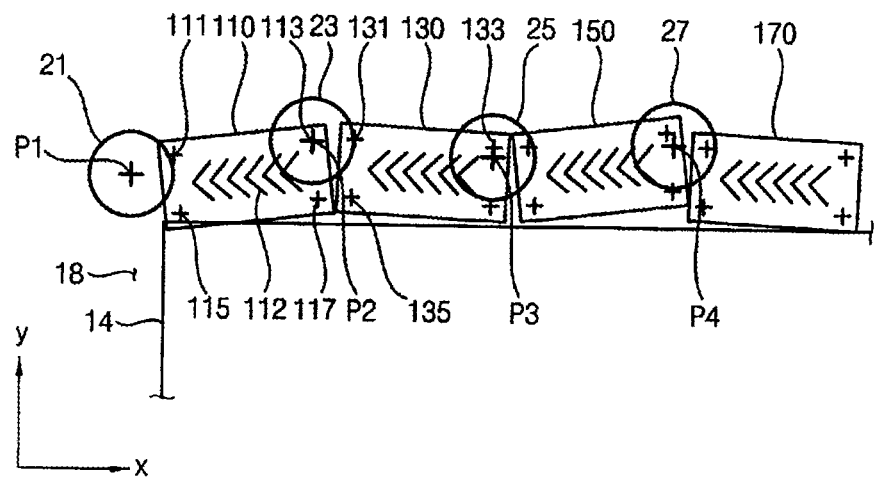

Thereafter, as illustrated in FIG. 2C, the second reference mark 113 spaced apart from the first reference mark 111 substantially in the first direction X is moved to the second center point P2 of the second microscope 23 adjacent to the first microscope 21 to assign second center point coordinates to the second center point P2 (step S33).

When the first reference mark 111 corresponds to the first center point P1, that is, the origin, displacement from the first reference mark 111 to the second reference mark 113 may be obtained from size information of the first reference mask 110.

The reference masks 110, 130, 150 and 170 and the reference marks 111, 113, 115 and 117 may be precisely manufactured to have an error ranging from about several to tens of nanometers. Thus, a moving distance of the second reference mark 113 to the second center point P2 is subtracted from the previously known displacement from the first reference mark 111 to the second reference mark 113 to detect the coordinates of the second center point P2.

The moving distance of the stage 14 may be measured by using an optical sensor fixed to the base 18, and the system control part may calculate the second center point coordinates by using the moving distance and the displacement from the first reference mark 111 to the second reference mark 113.

When the reference masks 110, 130, 150 and 170 are microscopically observed, the reference masks 110, 130, 150 and 170 are not exactly aligned but "crookedly" disposed, that is, disposed with a rotation error on an X-Y plane. Thus, alignment errors of the first reference mask 110 may be reflected in the second center point coordinates.

Accordingly, in order to compensate for the alignment error of the reference masks 110, 130, 150 and 170, before the second center point coordinates are assigned, that is, before the second reference mark 113 is moved to the second center point P2, the third reference mark 115 may be moved to the first center point P1 as illustrated in FIG. 2B.

The third reference mark 115 is spaced apart from the first reference mark 111 substantially in the second direction Y. When the third reference mark 115 is moved to the first center point P1, the angle of the first reference mask 110 rotated on the coordinate plane of the reference coordinate system may be determined from the moving distance in the first and second directions X and Y by using the system control part. Thus, the coordinates of the second reference mark 113 may be determined more accurately.

In order to correct the coordinates of the second reference mark 113, alternatively, before the second reference mark 113 is moved to the second center point P2, the second reference mark 113 may be moved to the first center point P1. In this case, since the first center point P1 is the origin, the coordinates of the second reference mark 113 may be detected directly from the moving distance of the second reference mark 113 in the first and second directions X and Y.

In this case, since a long side of the first reference mask 110 is disposed in the first direction X, the travel distance of the stage 14 is increased and a stage moving error may be added in comparison with correcting the coordinates of the second reference mark 113 by using the third reference mark 115 as described above. However, when a rotation error is measured by using the first and second reference marks 111 and 113, a displacement value is relatively large in comparison with measuring the rotation error by using the first and third reference marks 111 and 115. Thus, a measurement error may be reduced due to easy discrimination of an image.

Figure 2D:
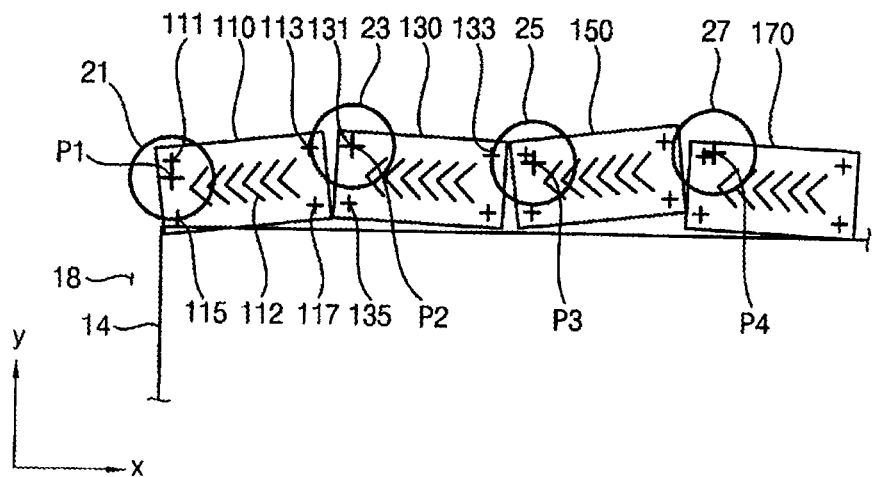

After assigning the second center point coordinates, as illustrated in FIG. 2D, a first reference mark 131 of the second reference mask 130 is moved to the second center point P2 (step S35). The second reference mask 130 is disposed adjacent to the first reference mask 110 in the first direction X.

The coordinates of the first reference mark 131 of the second reference mask 130 may be determined from a moving distance of the first reference mark 131 of the second reference mask 130 to the second center point P2.

Then, a process of determining a coordinate described in FIG. 2A to 2D is repeated on a reference of the coordinates of the first reference mark 131 of the second reference mask 130.

Figure 2E:
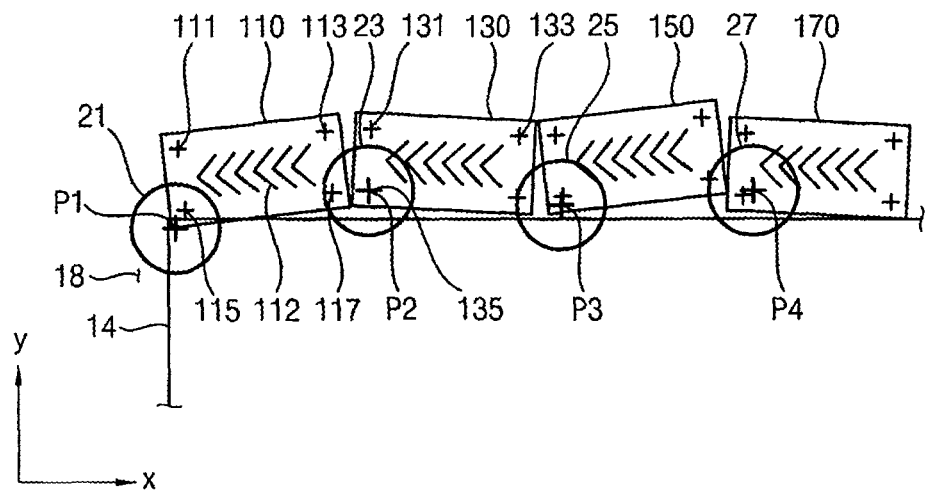

Thus, a third reference mark 135 of the second reference mask 130 is moved to the second center point P2 as illustrated in FIG. 2E. Accordingly, using the same logic as described above, the coordinates of the second reference mark 133 of the second reference mask 130 may be determined.

Thereafter, the third center point coordinates to the third center point P3 is assigned so that the second reference mark 133 of the second reference mask 130 corresponds to the third center point P3 of the third microscope 25 adjacent to the second microscope 23 (step S37).

The center point coordinates may be assigned with respect to a plurality of microscopes, for example, the first, second, third and fourth microscopes 21, 23, 25 and 27 by using the above described method. Thus, the origin and the reference coordinate system according to the first direction X and the second direction Y are determined, and the center point coordinates of the first, second, third and fourth microscopes 21, 23, 25 and 27 according to the reference coordinate system are determined.

Figure 3:
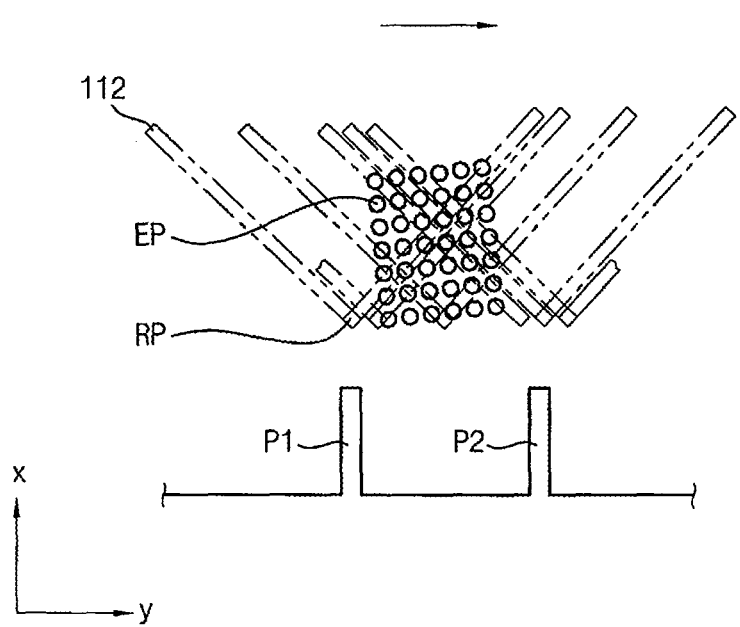
FIG. 3 is a plan view illustrating a method of assigning beam coordinates.

FIG. 3 is a plan view illustrating a method of assigning beam coordinates.

Referring to FIGS. 1 to 3, after the origin and the center point coordinates are assigned, the beam position detection marks 112 disposed between the first, second, third and fourth reference marks 111, 113, 115 and 117 are crossed with exposure points EP of exposure heads fixed to the base 18 to assign beam coordinates of the exposure points EP according to the reference coordinate system (step S50).

The number of the reference masks 110, 130, 150 and 170 may be determined by considering the number and sizes of the exposure heads and manufacturing precision according to sizes of the reference masks 110, 130, 150 and 170. When the reference masks 110, 130, 150 and 170 are connected in series along the first direction X by one row, a beam position is hard to detect at a connection portion between the reference masks 110, 130, 150 and 170.

Thus, the reference masks 110, 130, 150 and 170 may be arranged along the first direction X by two rows so as to detect the beam position at the connection portion between the reference masks 110, 130, 150 and 170.

Alternatively, in a case where the reference masks 110, 130, 150 and 170 are disposed along the first direction X by one row, after an exposure head, a beam position of which is measurable, is previously measured, the stage 14 may be moved in the first direction X by a predetermined distance to measure beam positions of remaining exposure heads.

In order to assign the beam coordinates, the exposure beam from the exposure head is irradiated onto the beam position detection marks 112 moved in the second direction Y by the stage 14. The exposure beam passing through the beam position detection marks 112 may be detected by using an optical sensor disposed under the beam position detection marks 112.

The shape of the beam position detection mark 112 may be variously modified. In an example embodiment, the beam position detection mark 112 may have a V-shape illustrated in FIG. 3, which is well known. For example, the beam position detection mark 112 may be similar to a beam position detection mark disclosed in Japanese Laid-Open Publication No. 2005-316461. Two pulses P1 and P2 may be detected from the exposure beam passing through the beam position detection marks 112 as illustrated in FIG. 3. The position of the exposure point EP may be detected from an interval between the pulses P1 and P2 obtained by measuring the moving distance of the stage 14 and a reference point RP (for example, a vertex point of the V-shape) of the beam position detection mark 112.

A displacement from the first reference mark 111 to the reference point RP is already determined in an error range of about 10 nm to about 20 nm from the shape of the first reference mask 110.

As a result, the beam coordinates may be generated by the position of the exposure beam with respect to the reference point RP and a moving distance of the beam position detection mark 112. The beam coordinates provide irradiation points of the exposure beams in the reference coordinate system.

According to the method of aligning an exposure apparatus of the present invention, a process of setting the reference coordinate system is simple so that the reference coordinate system may be easily set, and the beam coordinates of the exposure beams may be easily set according to the reference coordinate system. In addition, the number of the reference masks used corresponding to the size of the target object may be adjusted to be effective in enlargement of the target object.

Method of Exposing a Photoresist Film

Figure 4:
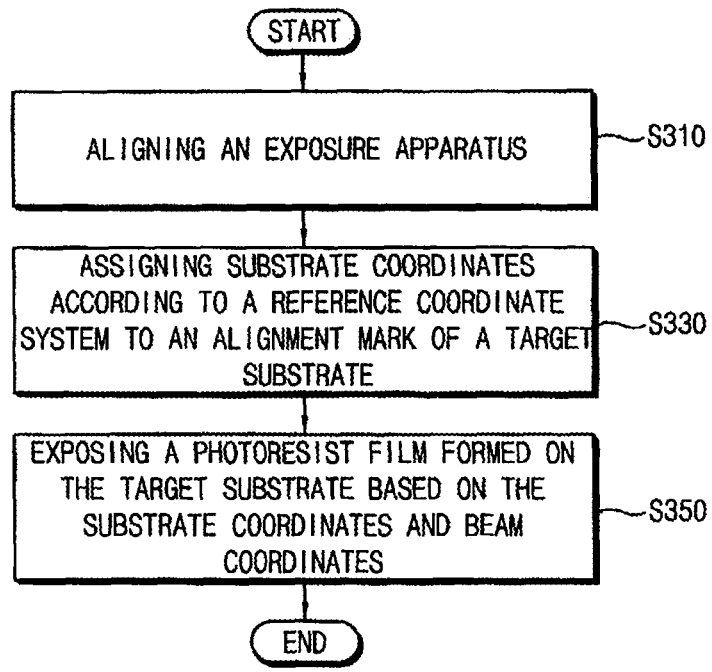
FIG. 4 is a flowchart illustrating a method of exposing a photoresist film formed on the target substrate by using the method of aligning the exposure apparatus illustrated in FIGS. 1 to 3.
Figure 5:
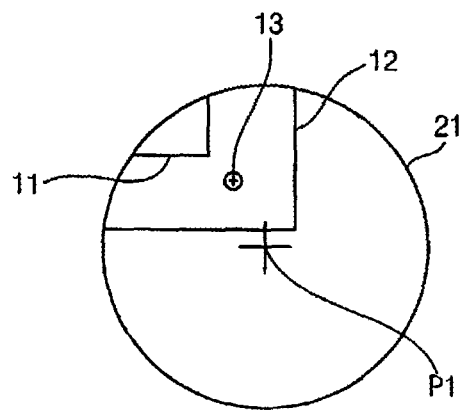
FIG. 5 is a plan view illustrating assigning substrate coordinates.
Figure 6:
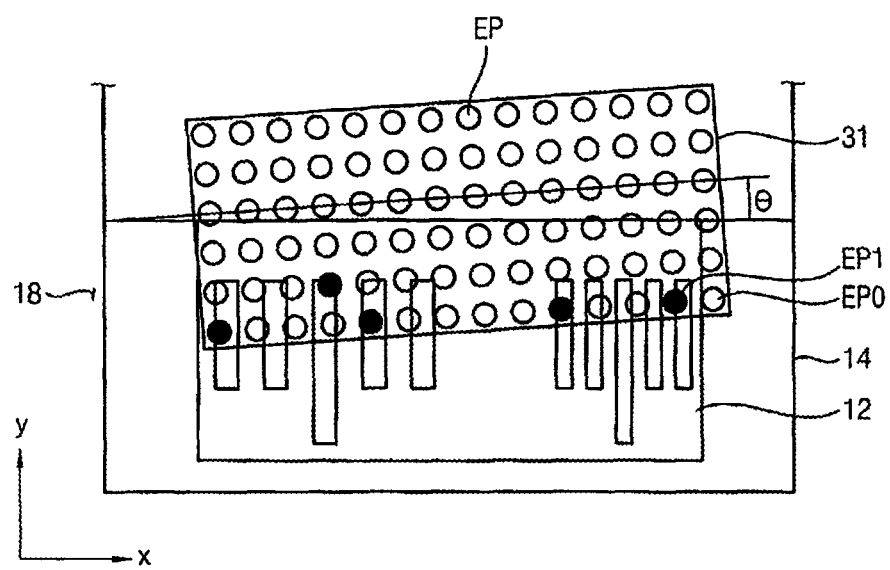
FIG. 6 is a plan view illustrating exposing a photoresist film.

FIG. 4 is a flowchart illustrating a method of exposing a photoresist film formed on the target substrate by using the method of aligning the exposure apparatus illustrated in FIGS. 1 to 3. FIG. 5 is a plan view illustrating assigning substrate coordinates. FIG. 6 is a plan view illustrating exposing a photoresist film.

Referring to FIGS. 4 and 5, in a method of exposing a photoresist film, a photoresist film 11 is formed on a target substrate 12 corresponding to an object to be exposed. When a pattern is formed on a substrate of a liquid crystal display (LCD) panel or on a printed circuit board (PCB), the photoresist film 11 is used to form a mask of the pattern. The photoresist film 11 may be formed by coating photosensitive resin such as an epoxy resin on a surface of a glass substrate.

In order to expose the photoresist film 11, first, an exposure apparatus is aligned (step S310). The method of aligning the exposure apparatus is substantially the same as the method of aligning the exposure apparatus described in FIGS. 1 to 3. Thus, the same reference numerals are used to refer to substantially the same elements of the exposure apparatus, and any further description for the method of aligning the exposure apparatus will be omitted.

By using the method of aligning the exposure apparatus, an origin is assigned to one of the center points P1, P2, P3 and P4 of the first, second, third and fourth microscopes 21, 23, 25 and 27 fixed to the base 18 and the reference coordinate system is determined. In addition, center point coordinates according to the reference coordinate system are assigned to remaining points of the first, second, third and fourth center points P1, P2, P3 and P4. The beam coordinates of the exposure points EP of the exposure heads are assigned by using a beam position determination pattern.

After the exposure apparatus is aligned, substrate coordinates according to the reference coordinate system is assigned to an alignment mark 13 of the target substrate 12 (step S330).

In order to assign the substrate coordinates, the target substrate 12 is loaded onto the stage 14. The stage 14 is moved and thus the alignment mark 13 of the target substrate 12 is, as illustrated in FIG. 5, moved into an observation area of an adjacent microscope, for example, the first microscope 21.

A displacement from the first center point P1 of the first microscope 21 to the alignment mark 13 is calculated by the system control part of the exposure apparatus. The displacement from the first center point P1 to the alignment mark 13 may be obtained from the number of pixels between the first center point P1 and the alignment mark 13 in an image observed by the first microscope 21. Analysis of the image and calculation of the number of the pixels may be performed in a data processing section such as a microprocessor of the system control part.

Thus, the substrate coordinates indicating the position of the alignment mark 13 in the reference coordinate system may be determined by the displacement from the first center point P1 to the alignment mark 13 and a moving distance of the alignment mark 13.

Finally, the photoresist film 11 formed on the target substrate 12 is exposed using the substrate coordinates and the beam coordinates (step S350).

Thus, moving of the stage 14 and scan timing of the exposure heads is controlled using the substrate coordinates and the beam coordinates. The control of the scan timing may be performed by the system control part.

The reference coordinate system, the center point coordinates, the substrate coordinates and the beam coordinates are generated by the data processing section of the system control part, and then stored in the data memory of the system control part. On the photoresist film 11, the exposure points EP of the exposure heads are controlled to turn on (EP1) and off (EP0) according to image data by the system control part. The image data designates the coordinates of areas to be exposed on the photoresist film 11, i.e., target coordinates.

The stage 14 moves the photoresist film 11 to under the exposure head along the second direction Y. As soon as the target coordinates of the photoresist film 11 corresponds to the exposure point EP of the exposure heads, the exposure points EP is turned on (EP1), as illustrated in FIG. 6.

The exposure beams may be irradiated onto the exposure points EP in accordance with the target coordinates and a digital signal by using a device known as a digital micromirror device (DMD). The beams are reflected from a digital mirror of an associated cell of the DMD to generate the exposure beam, and the exposure beam is emitted from the exposure head.

During a scan operation of the exposure head, the exposure beams are selectively irradiated onto the target coordinates on the photoresist film 11. As a result, properties of the photoresist film 11 corresponding to an exposed area are changed. After an exposure process according to an exposure method of the present invention, a photoresist pattern may be formed on the target substrate through a development process.

The exposure heads are arranged in a matrix of m rows and n columns, and the column is substantially parallel with the second direction Y. The exposure heads may be crookedly arranged by rows. Thus, exposure line width resolution may be greatly increased.

The rows of the exposure heads form an acute angle θ with respect to the first direction X. Thus, with a scan only in the second direction Y, the exposure pattern may be formed both in the second direction Y and in the first direction X.

Exposure Apparatus

Figure 7:
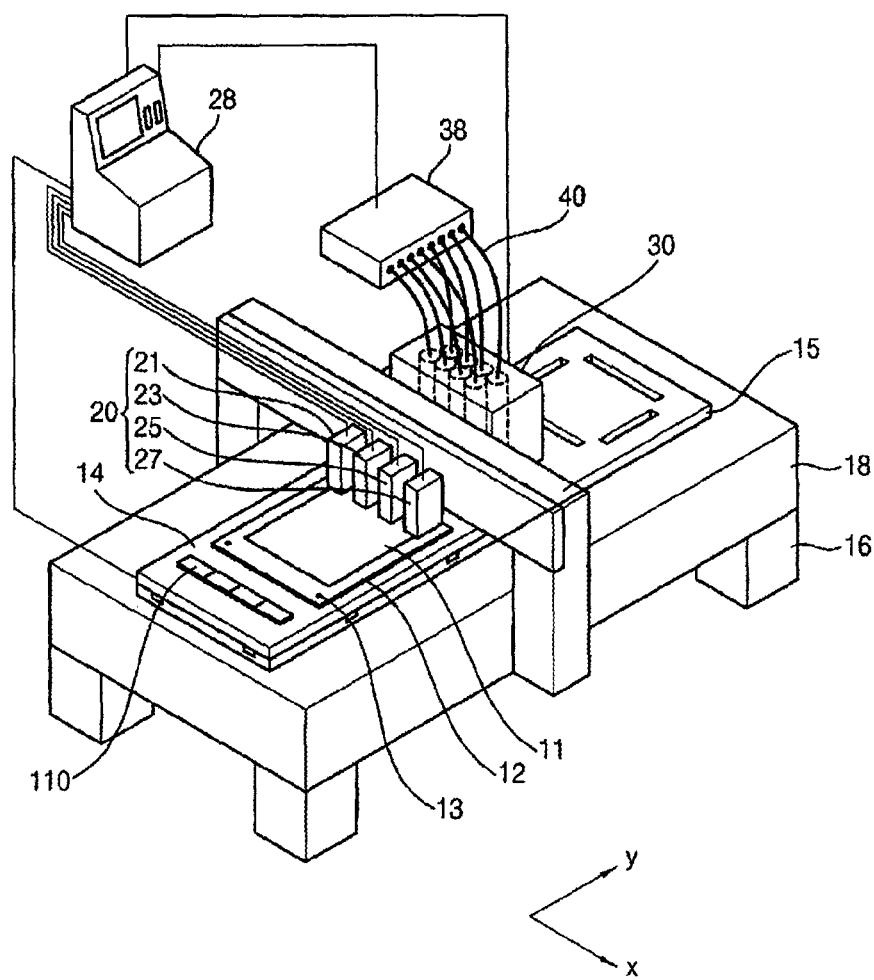
FIG. 7 is a perspective view illustrating an exposure apparatus according to an example embodiment of the present invention.

FIG. 7 is a perspective view illustrating an exposure apparatus according to an example embodiment of the present invention.

Referring to FIG. 7, an exposure apparatus 10 includes a base 18, a stage 14, reference masks 110, 130, 150 and 170, a photographing module 20, a scan module 30 and a system control part. For example, the external appearance of the exposure apparatus 10 in FIG. 7 may be similar to that of an exposure apparatus in Japanese Laid-Open Publication No. 2005-316461.

The base 18 is supported by a support 16 or a vibration isolation table.

The stage 14 moves a target substrate 12. The stage 14 is disposed on the base 18. The stage 14 may be moved on the base 18 in a width direction (hereinafter referred to as "first direction X") and in a length direction (hereinafter referred to as "second direction Y") of the stage 14.

Thus, a driving module 15 may be further disposed between the base 18 and the stage 14. The driving module 15 precisely drives the stage 14 within an error range of tens of nanometers. Thus, the driving module 15 drives the stage 14 in the first and second directions X and Y by using a linear motor and air bearings.

The exposure apparatus 10 may further include a position-detecting sensor such as a linear scaler or a laser interferometer. For example, the position-detecting sensor such as a laser interferometer irradiates light onto the stage 14 to measure a moving distance in the first and second directions X and Y of the stage 14, and controls a position in real time.

Figure 8:
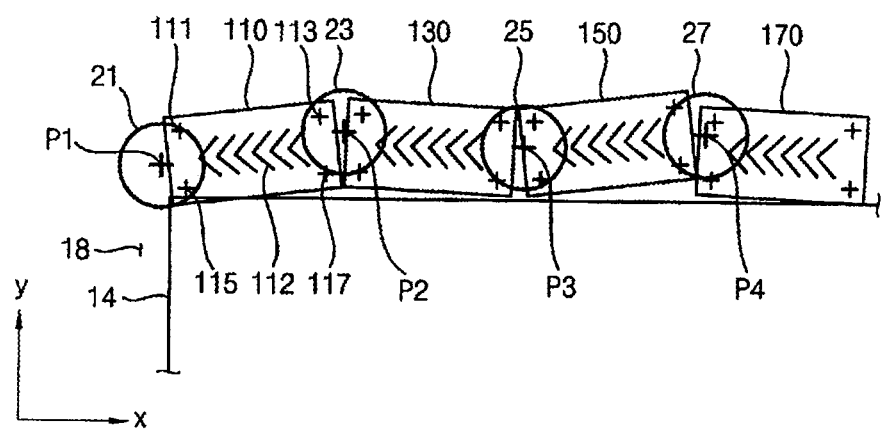
FIG. 8 is a plan view illustrating first, second, third and fourth reference masks illustrated in FIG. 7.

FIG. 8 is a plan view illustrating first, second, third and fourth reference masks illustrated in FIG. 7.

Referring to FIGS. 7 and 8, the first, second, third and fourth reference masks 110, 130, 150 and 170 are used to assign coordinates according to a single reference coordinate system to the photographing module 20 and the scan module 30.

The first, second, third and fourth reference masks 110, 130, 150 and 170 are disposed on an edge portion of the stage 14 in series along the first direction X. In other words, the exposure apparatus 10 according to an example embodiment of the present invention includes a plurality of reference masks disposed in series, to be effectively used when the target substrate 12 and the exposure apparatus 10 have large sizes. The first reference mask 110 may have a substantially rectangular plate shape, and may be formed using a material that exhibits almost no thermal deformation such as zerodur. A length direction of the first reference mask 110 is substantially parallel with the first direction X.

First, second, third and fourth reference marks 111, 113, 115 and 117 and beam position detection marks 112 may be formed on the first, second, third and fourth reference masks 110, 130, 150 and 170. The first, second, third and fourth reference marks 111, 113, 115 and 117 may have a cross shape or a rectangular shape, and the beam position detection mark 112 may have a slit pattern.

The first, second, third and fourth reference marks 111, 113, 115 and 117 are formed on four corner portions of the first, second, third and fourth reference masks 110, 130, 150 and 170. The first and third reference marks 111 and 115 are spaced apart from each other in the second direction Y. The second and fourth reference marks 113 and 117 are spaced apart from the first and third reference marks 111 and 115 in the first direction X, respectively.

The beam position detection marks 112 may be crossed with the exposure beam to obtain a displacement of the exposure beam from a reference point of a pattern. The shape of the beam position detection mark 112 may be variously modified. For example, the beam position detection mark 112 is the same to the beam position detection mark 112 illustrated in FIG. 3.

The beam position detection mark 112 corresponds to a light slit, and the light slit may have a substantially V-shape. The light slit may be formed by forming a metal layer, such as a layer of chromium formed by chrome plating on the glass, and opening a transmitting portion having a V-shape through the metal layer. The beam position detection marks 112 may be disposed so that the entrance of the V-shape is open in the first direction X.

The first, second, third and fourth reference masks 110, 130, 150 and 170 may be disposed differently from the positions illustrated in FIG. 8. For example, the first, second, third and fourth reference masks 110, 130, 150 and 170 may be not parallel with the first direction X but a little crookedly disposed as illustrated in FIG. 8. In FIG. 8, the first, second, third and fourth reference masks 110, 130, 150 and 170 are shown as exaggeratedly crooked for illustration purposes.

The photographing module 20 generates the reference coordinate system, and reads the coordinates of the target substrate 12. The photographing module 20 includes a plurality of microscopes, for example, first, second, third and fourth microscopes 21, 23, 25 and 27.

The first, second, third and fourth microscopes 21, 23, 25 and 27 are fixed to the base 18 with respect to their positions. Thus, first, second, third and fourth center points P1, P2, P3 and P4 of the first, second, third and fourth microscopes 21, 23, 25 and 27 have constant positions with respect to the base 18.

The first, second, third and fourth reference masks 110, 130, 150 and 170 are moved in the first direction X and in the second direction Y by the stage 14 according to a predetermined order described later, so that reference marks correspond to the first, second, third and fourth center points P1, P2, P3 and P4 of the first, second, third and fourth microscopes 21, 23, 25 and 27, respectively.

An origin of the reference coordinate system is assigned to one of the first, second, third and fourth center points P1, P2, P3 and P4, so that the reference marks successively correspond to the first, second, third and fourth center points P1, P2, P3 and P4 of the first, second, third and fourth microscopes 21, 23, 25 and 27, respectively.

In addition, center point coordinates are assigned to remaining points of the first, second, third and fourth center points P1, P2, P3 and P4 relative to the origin, based upon a moving distance in the first and second directions X and Y of the stage 14 and the predetermined relative positional relationship of the first, second, third and fourth reference marks 111, 113, 115 and 117.

The first, second, third and fourth microscopes 21, 23, 25 and 27 observe substrate coordinates of an alignment mark of the target substrate 12. Since the center point coordinates of the first, second, third and fourth microscopes 21, 23, 25 and 27 are predetermined in the reference coordinate system, the coordinates of the alignment mark in the reference coordinate system may be determined by a displacement from the center point coordinates to the alignment mark and the moving distance of the stage 14.

Figure 9:
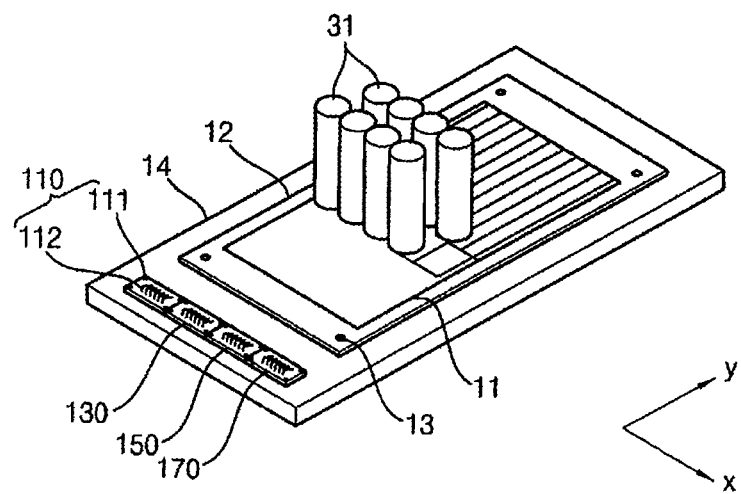
FIG. 9 is a perspective view illustrating a scan module illustrated in FIG. 7.
Figure 10:
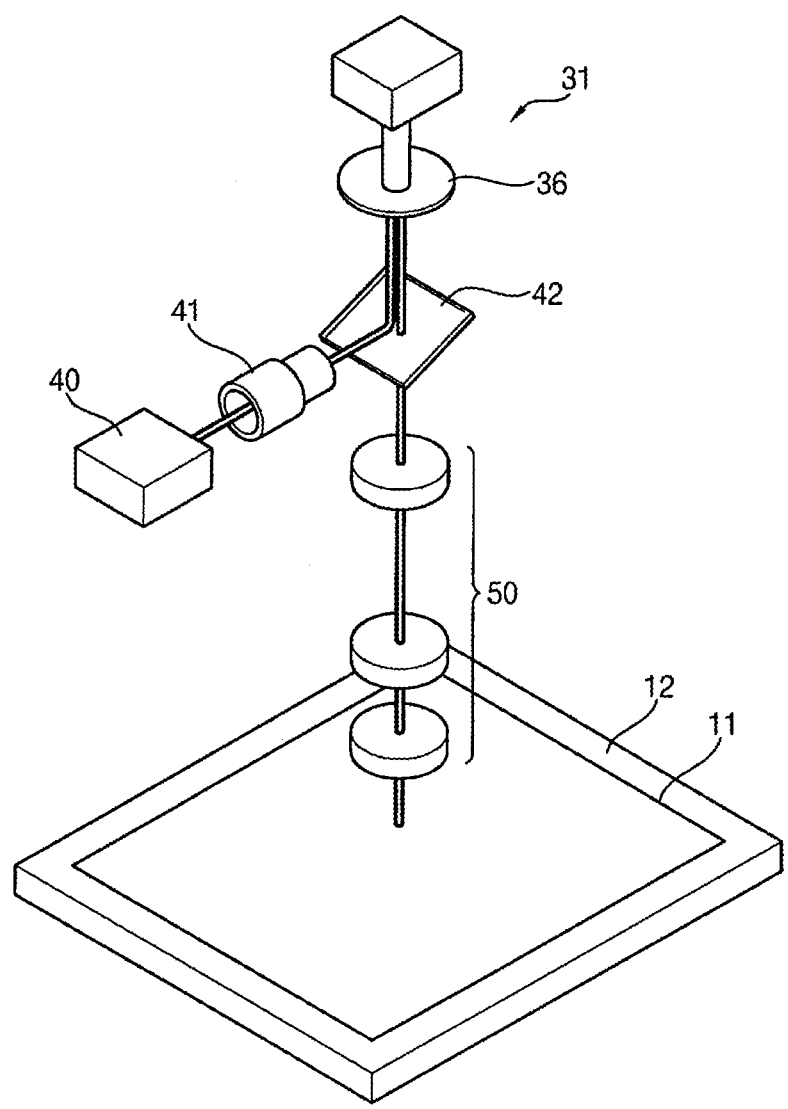
FIG. 10 is a perspective view illustrating an example of an exposure head illustrated in FIG. 9.

FIG. 9 is a perspective view illustrating a scan module illustrated in FIG. 7. FIG. 10 is a perspective view illustrating an example of an exposure head illustrated in FIG. 9.

Referring to FIG. 9, the scan module 30 includes a plurality of exposure heads 31. For example, the external appearance of the scan module 30 in FIG. 9 may be similar to that of a scan module disclosed in Japanese Laid-Open Publication No. 2005-316461. The exposure heads 31 are fixed to the base 18 with respect to their positions. Thus, positions of exposure points of the exposure heads 31 are constant. The exposure heads 31 selectively irradiate exposure beams onto the exposure points.

The exposure heads 31 are arranged in a matrix of m rows and n columns. The rows are substantially parallel with the second direction Y. The rows form an acute angle θ with respect to the first direction X. The exposure heads 31 are a little crookedly arranged by rows. Thus, in a scan in the second direction Y, the exposure heads 31 are arranged so that an area that is not scanned does not exist.

Referring to FIG. 10, each exposure head 31 may include a DMD 36 and an optical device 50.

The DMD 36 receives source beams from a laser source. The source beams may correspond to an ultraviolet (UV) ray for exposing a photoresist film. The DMD 36 of which pixels selectively reflect the source beams based on image data transferred onto the target substrate 12.

The optical device 50 includes a plurality of lenses, and converts light selectively reflected from the DMD 36 into the exposure beam.

The beam coordinates of the exposure heads 31 are determined by the beam position detection marks 112. The exposure heads 31 irradiate beams of coordinates corresponding to the image data.

Figure 11:
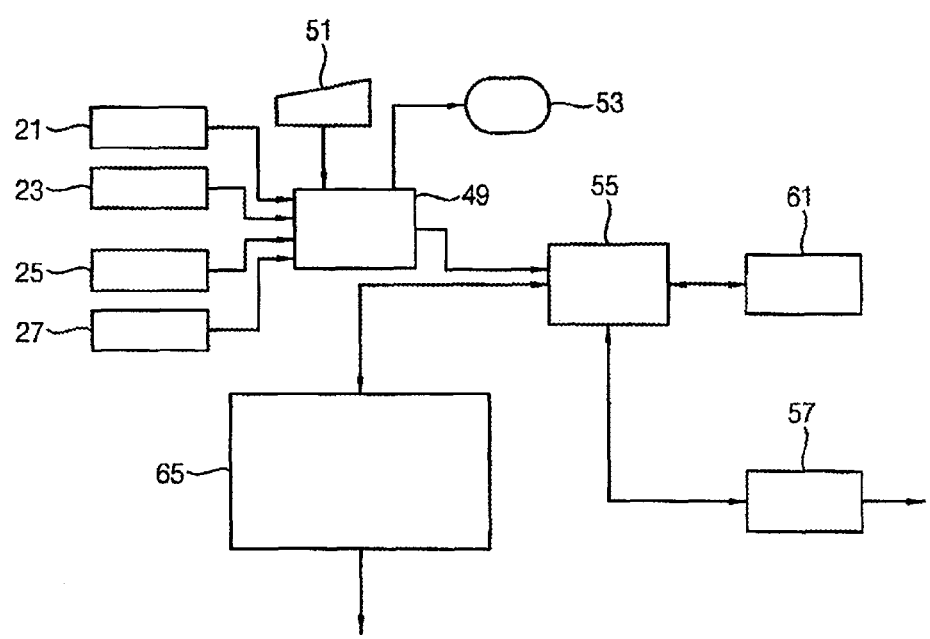
FIG. 11 is a block diagram illustrating an example of a system control part illustrated in FIG. 7.

FIG. 11 is a block diagram illustrating an example of a system control part illustrated in FIG. 7.

Referring to FIG. 11, the system control part may include a data processing section 55, a moving control section 65, a scan control section 57, an image processing section 49 and a data memory 61.

The first, second, third and fourth microscopes 21, 23, 25 and 27 are coupled to the image processing section 49, calculation of the displacement between the alignment mark 13 and the center points of the microscopes and calculation of the substrate coordinates is performed in the image processing section 49. A keyboard 51 indicating the start of a process or a display device 53 emphasizing an image observed by the first, second, third and fourth microscopes 21, 23, 25 and 27 or displaying a process may be coupled to the image processing section 49.

The data processing section 55 corresponds to a control section managing the system control part, and moving of the stage 14 and scan timing of the scan module 30 is controlled based on the substrate coordinates and the beam coordinates.

The data processing section 55 generates the center point coordinates and the beam coordinates based on the origin, the moving distance and a positional relationship between the reference mark and the beam position detection marks 112. In addition, the data processing section 55 corrects the image data and generates target coordinates designating an exposure position of the photoresist film 11 formed on the target substrate 12 based on the substrate coordinates and the beam coordinates.

The moving control section 65 outputs a moving signal for moving the stage 14 in the first and second directions X and Y. The scan control section 57 controls on and off timing of the exposure beams by using the moving signal and the target coordinates.

The data memory 61 may store and read the reference coordinate system, the center point coordinates, the substrate coordinates and the beam coordinates.

According to the above exposure apparatus, the center point of the microscope is allowed to correspond to the reference mark of the reference mask, or the coordinates of the exposure head using the beam position detection marks is confirmed. Thus, the center point coordinates, the beam coordinates and the substrate coordinates according to the reference coordinate system may be easily and accurately generated.

In addition, the number of the reference masks arranged in series may be increased or decreased in accordance with the size of the target substrate. Thus, a photoresist film of a large-size target substrate may be exposed, and the efficiency of an exposure process may be enhanced.

According to the method of aligning an exposure apparatus, the method of exposing a photoresist film by using the method and the exposure apparatus for performing the method of exposing a photoresist film, an exposure apparatus may be easily aligned, and alignment errors may be greatly reduced, thereby increasing exposure quality such as overlay quality, and allowing an alignment process and an exposure process of a large-size target substrate to be effectively performed. Thus, the present invention may be effective for increasingly larger target objects such as a substrate of an LCD panel, and applied to enhancing the precision and yield of an exposure process for a large-size target.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of aligning an exposure apparatus, comprising:
   moving a first reference mark formed on a first reference mask to a first center point of a first microscope to assign an origin to the first center point;
   obtaining coordinates of a second reference mark on the first reference mask by moving a third reference mark on the first reference mask to the first center point, the third reference mark spaced apart from the first reference mark;
   moving the second reference mark to a second center point of a second microscope to assign second center point coordinates to the second center point; and
   moving a first reference mark of a second reference mask to the second center point, wherein the second reference mask is arrayed in series next to the first reference mask.

2. The method of claim 1, wherein assigning the second center point coordinates further comprises:
   prior to moving the second reference mark of the first reference mask to the second center point,
   moving the second reference mark to the first center point to obtain the coordinates of the second reference mark.

3. The method of claim 1, wherein
   the moving a first reference mark assigns the origin of a reference coordinate system to the first center point, and
   the first and second microscopes are fixed to a base.

4. The method of claim 3, further comprising:
   crossing beam position detection marks disposed between the first and second reference marks with an exposure point of exposure heads fixed to the base to assign beam coordinates to the exposure point according to the reference coordinate system.

5. The method of claim 4, further comprising:
   irradiating an exposure beam onto the beam position detection marks using the exposure heads; and
   generating the beam coordinates based on the position of the exposure beam with respect to the beam position detection marks and a moving distance of the beam position detection marks.

6. The method of claim 3, further comprising:
   assigning substrate coordinates according to the reference coordinate system to an alignment mark of a target substrate observed by the first and second microscopes.

7. A method of aligning an exposure apparatus, comprising:
   assigning an origin of a reference coordinate system to a first center point of a plurality of microscopes fixed to a base;
   assigning center point coordinates to a second center point according to the reference coordinate system by corresponding reference marks to the second center point, wherein the reference marks are formed on a plurality of reference masks; and
   crossing beam position detection marks disposed between the reference marks with an exposure point of exposure heads fixed to the base to assign beam coordinates to the exposure point according to the reference coordinate system.

8. The method of claim 7, further comprising:
   irradiating an exposure beam onto the beam position detection marks using the exposure heads; and
   generating the beam coordinates based on the position of the exposure beam with respect to the beam position detection marks and a moving distance of the beam position detection marks.

9. The method of claim 7, further comprising:
   assigning substrate coordinates according to the reference coordinate system to an alignment mark of a target substrate observed by each of the plurality of microscopes.

10. A method of exposing a photoresist film, comprising:
    moving a reference mask array having reference masks to an observation area of a plurality of microscopes so that reference marks correspond to center points of the plurality of microscopes fixed to a base, wherein the reference marks are formed on the reference masks;
    assigning an origin of a reference coordinate system to a first center point of the center points;
    assigning center point coordinates to a second center point according to the reference coordinate system;
    crossing beam position detection marks formed between the reference marks with exposure points of exposure heads to assign beam coordinates to the exposure points according to the reference coordinate system;
    moving a target substrate to the observation area of each of the plurality of microscopes to assign substrate coordinates to an alignment mark of the target substrate according to the reference coordinate system; and
    turning the exposure points on and off in accordance with image data indicating a transfer pattern in order to expose a photoresist film formed on the target substrate by using the substrate coordinates and the beam coordinates.

11. The method of claim 10, further comprising:
    irradiating an exposure beam onto the beam position detection marks using the exposure heads; and
    generating the beam coordinates based on the position of the exposure beam with respect to the beam position detection marks and a moving distance of the beam position detection marks.

* * * * *